United States Patent
Erhardt et al.

(10) Patent No.: US 6,835,662 B1
(45) Date of Patent: Dec. 28, 2004

(54) PARTIALLY DE-COUPLED CORE AND PERIPHERY GATE MODULE PROCESS

(75) Inventors: Jeff P. Erhardt, San Jose, CA (US); Hiroyuki Kinoshita, Sunnyvale, CA (US); Cyrus Tabery, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 16 days.

(21) Appl. No.: 10/619,797

(22) Filed: Jul. 14, 2003

(51) Int. Cl.[7] .................. H01L 21/302; H01L 21/4763; H01L 21/336
(52) U.S. Cl. ................. 438/689; 438/669; 438/587; 438/585; 438/275; 438/258
(58) Field of Search ................. 438/689, 669, 438/585, 587, 595, 258, 241, 275

(56) References Cited

U.S. PATENT DOCUMENTS

| | | | |
|---|---|---|---|
| 5,290,723 A | * | 3/1994 | Tani et al. .................. 438/594 |
| 5,470,774 A | * | 11/1995 | Kunitou ..................... 438/278 |
| 5,747,359 A | * | 5/1998 | Yuan et al. .................. 438/657 |
| 6,416,933 B1 | * | 7/2002 | Singh et al. ................. 430/313 |
| 6,475,891 B2 | * | 11/2002 | Moon ......................... 438/584 |
| 6,780,708 B1 | * | 8/2004 | Kinoshita et al. ........... 438/241 |
| 2002/0063277 A1 | | 5/2002 | Ramsbey et al. ........... 257/316 |

OTHER PUBLICATIONS

U.S. Appl. No. 10/619,804; filed Jul. 14, 2003, Tabery et al., Process for Core and Periphery Masking with Transistor Spacer and Small Core Space Formation.

* cited by examiner

Primary Examiner—Michael Trinh
(74) Attorney, Agent, or Firm—Renner, Otto, Boisselle & Sklar, LLP

(57) ABSTRACT

The invention is an apparatus and a method of manufacturing a structure. The method includes the step of patterning a layer to include a line and space pattern. A space of the line and space pattern in a first region includes a first critical dimension less than achievable at a resolution limit of lithography. A line of the line and space pattern in a second region includes a second critical dimension achievable at a resolution limit of lithography. A sidewall spacer is formed on a line from a masking layer used in the formation of the structure. The method uses one critical masking step and two non-critical masking steps.

13 Claims, 4 Drawing Sheets

PARTIALLY DE-COUPLED CORE AND PERIPHERY GATE MODULE PROCESS

TECHNICAL FIELD

The present invention generally relates to the manufacture of semiconductor devices and, more specifically, relates to the manufacturing of semiconductor devices by a partially de-coupled core and periphery gate module process.

BACKGROUND ART

In the semiconductor industry, manufacturers scale down the device dimensions to increase the performance as well as reduce the cost of manufacture. The scaling down of devices has led to the development of several new processing techniques. In the manufacture of certain devices, wet etching has been replaced with dry etching (plasma etching, reactive ion etching and ion milling). Low-resistivity suicides and refractory metals are used as replacements for high-resistivity polysilicon interconnections. Multiple-resists have been developed to compensate for wafer surface variations that thwart accurate fine-line lithography.

However, improved lithography processing techniques continue to be the main factor in the ability to scale devices. Improvements have come in, for example, lithographic tools, such as 1:1 optical projection systems fitted with deep-ultraviolet source and optics. Further, new photoresist materials have been introduced. Further still, new processes have been developed, such as a multilayer resist utilizing a top resist sensitized to X-ray or electron-beam and a bottom straight optical resist layer(s).

DISCLOSURE OF INVENTION

Despite the enhancements to lithographic tools, materials and processes, there exists a strong need in the art for an invention which forms a line and space pattern including at least two variable critical dimensions on a substrate sub-divided into regions. Further, there is a need for an invention that forms a line and space sub-pattern in one region that includes a first feature comprising a first critical dimension different than a second critical dimension of a second feature in another region of the substrate. Further, there is a need to form one of the features to include a critical dimension less than achievable at a resolution limit of lithography. Further still, there is a need to form one of the features to include a critical dimension achievable at a resolution limit of lithography. Additionally, there is a need for an invention that saves steps in a manufacturing process by reducing the number of steps used to form a mask used in the process. For example, a second mask layer used to form spacers in one region to reduce the lateral dimension in a hard mask may also be used to form spacers, e.g., transistor spacers, on the sidewalls of gates previously formed in another region. Additionally, there exists a need for an invention that forms gates and spaces comprising different critical dimensions in the at least two regions of the substrate that reduces the processing steps required to form the gates and spaces.

According to one aspect of the invention, the invention is a method of forming a layer comprising a line and space pattern over a substrate including a first region and a second region, the method comprising the steps of: depositing and patterning a first hard mask layer over the layer to form a master line and space pattern therein, wherein a first master line and space pattern in the hard mask layer includes at least one line and at least one space of a minimum dimension dictated by a resolution limit of lithography; etching the layer to form the line and space pattern in the second region corresponding to the first master line and space pattern in the hard mask layer in the second region, wherein a line in the second region includes a first critical dimension (B) achievable at the resolution limit of lithography; depositing a second hard mask layer over the patterned first hard mask layer, etching the second hard mask layer to form sidewall spacers on sidewalls of at the least one line in the hard mask layer in the first region, wherein the minimum dimension of the at least one space in the first hard mask layer in the first region is reduced to a second critical dimension (A) less than achievable at the resolution limit of lithography; to form sidewall spacers on sidewalls of the at least one line in the second region; and etching the layer to form the line and space pattern in the first region corresponding to the first master line and space pattern in the hard mask layer in the first region, wherein a space in the first region includes the second critical dimension (A) less than achievable by the resolution limit of lithography.

According to another aspect of the invention, the invention is a method of patterning a layer on a substrate including a first region and a second region, the method comprising the steps of: providing a substrate including the layer to be patterned interposed between the substrate and a first hard mask layer to be patterned; coating the first hard mask layer to be patterned with a first photosensitive layer; patterning and etching the first photosensitive layer to form a first patterned image including lines and at least one space, the lines in the first photosensitive layer and the at least one space include substantially vertical walls and include a minimum dimension (B) achievable at a resolution limit of lithography; transferring to the first hard mask layer the first patterned image by anisotropically etching the first hard mask layer to form lines and at least one space, the lines and the at least one space in the first hard mask layer include substantially vertical walls and the minimum dimension (B) achievable at the resolution limit of lithography; coating the first hard mask layer with a second photosensitive layer; patterning and etching the second photosensitive layer to form a second patterned image including a mask over the first region and exposing the second region; etching the layer in the second region to form a line and space pattern therein including at least one line in the second region including the critical dimension (B) achievable at the resolution limit of lithography; depositing a conformal hard mask layer over the hard mask layer, exposed surfaces of the layer and exposed surfaces of the substrate; forming sidewall spacers on the vertical walls of the lines of the first hard mask in the first region whereby the minimum dimension (B) of the at least one space in the first region is reduced; forming sidewall spacers on the vertical walls of the at least one line in the second region; coating the substrate with a third photosensitive layer; patterning and etching the third photosensitive layer to form a third patterned image, wherein the first region is exposed and a remaining portion of the third photosensitive layer acts as a mask in the second region; etching the layer in the first region to form a line and space pattern, wherein the at least one space in the layer in the first region includes a second critical dimension (A) less than achievable by the resolution limit of lithography.

According to another aspect of the invention, the invention is a semiconductor device, comprising: a semiconductor substrate including a first region, a second region and an active region; a dielectric layer formed over the semiconductor substrate; a conductive layer formed over the dielectric layer, wherein the conductive layer includes: a first pattern in the first region comprising lines and an opening, the opening includes a first critical dimension (A) less than achievable at a resolution limit of lithography, and a second pattern in the second region comprising at least one line including a second critical dimension (B) achievable at a resolution limit of lithography; and a sidewall spacer formed on a sidewall of the at least one line, the sidewall spacer being formed from a hard mask layer.

BRIEF DESCRIPTION OF DRAWINGS

These and further features of the present invention will be apparent with reference to the following description and drawings, wherein.

MODE(S) FOR CARRYING OUT THE INVENTION

Figure 1:
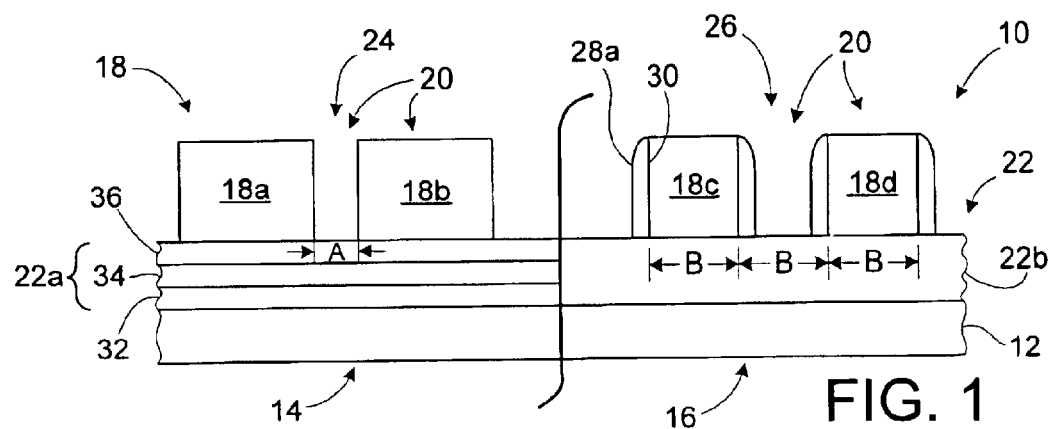
FIG. 1 is a cross-section of a layer including a line and space pattern on a substrate, the line and space pattern including a first pattern of lines and spaces in a first region wherein a space includes a lateral dimension less than achievable by a resolution limit of lithography and a second pattern of lines and spaces in a second region wherein a line includes a lateral dimension achievable at the resolution limit of lithography and a sidewall spacer formed thereon, according to an embodiment of the present invention.

In the detailed description that follows, identical components have been given the same reference numerals. To illustrate the present invention in a clear and concise manner, the drawings may not necessarily be to scale and certain features may be shown in a partial schematic format.

The present invention comprises a layer, including a line and space pattern, disposed over a substrate or wafer. The substrate includes at least two regions, e.g., a first region and a second region. The first region may be a core region, whereas the second region may be a periphery region.

The line and space pattern over the first region or core region includes a first line and space sub-pattern comprising a first feature including a first critical dimension less than achievable at a resolution limit of lithography. The first critical dimension may be, e.g., a lateral dimension of a space. Further, the line and space pattern over the second region or periphery region includes a second line and space sub-pattern comprising a second feature including a second critical dimension that is determined by a device parameter. The second critical dimension may be, e.g., a lateral dimension of a line. The second critical dimension is achievable at the resolution limit of lithography.

Additionally, a sidewall spacer (e.g., a transistor spacer) may be formed on the sidewalls of a line in the second region. The sidewall spacer is formed from a second mask layer used in forming the hard mask for patterning the layer in the core region. The line in the second region may be a gate electrode of a gate, for example.

In other words, the layer includes a line and space pattern comprising varying pitch and at least two critical dimensions. Additionally, a transistor spacer is formed on the sidewall of the gate (e.g., a periphery gate or transistor) from a second mask layer used in the formation of a master hard mask used in the core region to transfer a first master line and space sub-pattern to the layer. Further, a space in the first region includes a lateral dimension less than achievable at a resolution limit of lithography. Additionally, at least one line in the second region includes a critical dimension achievable at a resolution limit of lithography.

The present invention includes a method of patterning a layer comprising varying pitch and at least two critical dimensions that also results in the formation of a transistor spacer from a second mask layer used in forming a master hard mask for patterning of the layer. The method uses one critical masking step and two non-critical masking steps to pattern the layer. The method includes a step of forming the layer on or over a substrate or wafer including at least two regions, e.g., a first region and a second region.

Next, a first hard mask is formed that includes a first line and space pattern comprising a pitch and at least one critical dimension achievable at the resolution limit of lithography. Thus, the second master line and space sub-pattern is formed.

The first line and space pattern over the second region, i.e., the second master line and space sub-pattern, is transferred to the layer first. Thus, the second line and space sub-pattern is formed in the layer. This is one of two etch steps used to transfer the master line and space pattern to the layer. Then, a second mask layer is deposited over the intermediate structure and etched to form sidewall spacers on the sidewalls of the lines of the first and second regions. The lines in the first region are part of the first hard mask. The lines in the second region include the gate electrodes. The sidewall spacers in the first region reduce the minimum dimension of at least one space in the first hard mask to the first critical dimension less than achievable at a resolution limit of lithography. Thus, the first master line and space sub-pattern is formed. The sidewall spacers in the second region form a spacer, e.g., a transistor spacer, on the sidewalls of the at least one line comprising the second critical dimension. Next, the first master line and space sub-pattern is transferred to the layer in the first region. Thus, the layer is formed with the line and space pattern including variable pitch and at least two critical dimensions. Additionally, the transistor spacer is formed on the sidewall of a periphery gate or transistor from the second mask layer used in the formation of the master hard mask used in the core region to transfer the first master line and space sub-pattern to the layer.

In one embodiment, a semiconductor device is formed using a method further described below. A conductive layer is patterned to form gates (e.g., core gates, periphery gates or the like) and spaces in the first region (e.g., a core region) and the second region (e.g., a periphery region) including varying pitch and at least two critical dimensions. A sidewall spacer(s), also referred to herein as a transistor spacer(s), is formed on the sidewall(s) of a gate formed in one of the regions. The sidewall spacer(s) is formed from a second mask layer used to form the master hard mask used to pattern the conductive layer in the core region.

In this embodiment, the method provides a means for reducing the space between the gates (e.g., core gates) in the core region by increasing the lateral dimensions of the gates in the core region. Additionally, the gates (e.g., periphery gates) and spaces formed in the periphery region include a lateral dimension achievable at the resolution limit of lithography. Further, at least one gate in the periphery region includes the aforementioned transistor spacer.

Thus, the space between the core gates includes a lateral dimension less than achievable at a resolution limit of lithography. Further, the periphery gates include a lateral dimension achievable at a resolution limit of lithography. Further still, the periphery gates include sidewall spacers formed from the second mask layer used in forming the master hard mask used in patterning the conductive layer in the core region. The semiconductor device resulting from the method includes significantly increased performance while being produced at significantly reduced manufacturing costs.

Starting with a substrate (e.g., semiconductor, insulator or metal) including a first region and a second region, a layer to be patterned is formed over the substrate. Next, a first mask layer of, for example, an insulator material, such as silicon oxide ($Si_xO_y$), is formed on the layer to be patterned. In one embodiment, the first mask layer includes a high temperature oxide (HTO). In one embodiment, an antireflective coating (ARC) of silicon rich nitride (SiRN), for example, is deposited on the first mask layer. Then, a first layer of photosensitive material is applied. The first layer of photosensitive material is patterned by lithographic means to form a first lithographic image. The first lithographic image includes lines and spaces in the first layer of photosensitive material in the first region and the second region. The lines and spaces include a minimum dimension achievable at a resolution limit of lithography.

Next, the first lithographic image is transferred to the first mask layer by an etch process, e.g., a plasma etch process. Thus, the first hard mask is produced including the first line and space pattern. The first line and space pattern includes lines and spaces including the minimum dimension achievable by the resolution limit of lithography. Then, an etch process, e.g., a directional reactive ion etching (RIE), is performed to remove the remaining first layer of photosensitive material.

Next, a second layer of photosensitive material is applied to the first hard mask. The second layer of photosensitive material is now patterned by lithographic means to form a second lithographic image. The second lithographic image exposes the second region and forms a mask over the first region. Following the removal of the second layer of photosensitive material over the second region, the exposed first hard mask in the second region can be used to transfer the first line and space pattern, i.e., the second master line and space sub-pattern, in the second region to the layer in the second region. Next, the remaining portion of the second layer of photosensitive material is removed using an etch process as described above.

The lines and spaces formed in the layer in the second region include a dimension (B) dictated by a device parameter. The critical dimension (B) may be a minimum dimension achievable at the resolution limit of lithography. The critical dimension is dictated by desired device parameters and the lithography apparatuses used.

Thereafter, to further reduce the size of the spaces in the first hard mask in the first region and to form a sidewall spacer on the lines formed in the layer in the second region, a second mask layer is applied to the intermediate structure. The thickness of the second mask layer is determined by the desired reduction in the size of the spaces in the first hard mask in the first region. For example, for an elongated opening (space), the reduction in the width of the space is approximately twice the width of the second mask layer. The second mask layer may be HTO, e.g., formed by chemical vapor deposition (CVD), plasma enhanced chemical vapor deposition (PECVD) or other processes known by those having ordinary skill in the art.

Another etch process, for example, another RIE using a different etchant species, is used to remove portions of the second mask layer from the horizontal surfaces of the first hard mask (and/or ARC, if used) and portions of the horizontal surfaces of the layer exposed by the spaces. The RIE leaves portions of the second mask layer on the non-horizontal surfaces corresponding to the sidewalls of the lines in the first hard mask in the first region, also referred to herein as hard mask spacers. Thus, the master hard mask is formed. The master hard mask includes the first master line and space sub-pattern formed over the first region. Additionally, sidewall spacers are formed on the sidewalls of the lines in the second region, also referred to herein as transistor spacers of hard mask material.

The ARC exposed by the etch process in the first and second regions may be removed by another etch process selective to the ARC. Alternatively, an ARC strip may be performed to remove the remaining ARC material. It should be understood by those having ordinary skill in the art that removal of the ARC at this time is optional. If the ARC is not removed, then the ARC functions as part of the master hard mask.

The first hard mask, including the hard mask spacers and the transistor spacers, constitutes a new mask (a second hard mask or stencil). In the first region, the new mask includes spaces with a critical dimension less than achievable by lithography processes alone. In the second region, the new mask includes lines with a critical dimension achievable at the resolution limit of lithography.

Next, a third layer of photosensitive material is applied to the second hard mask. The third layer of photosensitive material is now patterned by lithographic means to form a third lithographic image. The third lithographic image exposes the first region and forms a mask over the second region. This is considered a non-critical masking step. Following the removal of the third layer of photosensitive material over the first region, the exposed portion of the new mask can be used to transfer the first master line and space sub-pattern in the first region to the layer in the first region. Next, the remaining portion of the third layer of photosensitive material is removed using an etch process as described above.

Thus, the new mask may be used to form gates and spaces in the first region comprising a space including a critical dimension less than achievable at the resolution limit of lithography. Further, the new mask may be used to form gates and spaces in the second region comprising a gate including a critical dimension dictated by a device parameter and achievable at a resolution limit of lithography. Additionally, a sidewall spacer may be formed on the sidewall of a gate formed in the second region during the above-described process.

The new mask can be used for a variety of other purposes, including ion implantation to implant the layer or the substrate through an intervening layer(s). Alternatively, if the substrate is exposed, the substrate may be implanted directly. Further, the new mask may be used as an etch mask to etch narrow trenches in an underlying layer(s), substrate or both. Further still, the new mask may be used as an oxidation mask to form recessed oxide isolation in the exposed regions of the layer or substrate. Additionally, the new mask may be used as a contact mask to establish narrow dimensioned contacts on the layer or exposed regions of the substrate, etc.

Following such use, the new mask may be removed from the horizontal surfaces of the layer by subjecting the new mask to a wet or dry etchant. The sidewall spacer formed on the sidewall of a gate in the second region is reduced in size accordingly. If the structure includes at least one gate stack structure of a typical gate, e.g., metal on semiconductor field effect transistor (MOSFET), floating gate (FG), semiconductor oxide-nitride-oxide semiconductor (SONOS) gate or the like, then conventional processes may be used to complete the semiconductor device(s). Those with ordinary skill in the art will understand additional spacers, wordlines, bitlines, contacts, and source and drain regions, for example, may be formed to complete a working device. For brevity sake and to focus on the inventive aspects of the present invention, the features and the processes associated with the formation of such features will not be further discussed in the present application.

Referring initially to FIG. 1, a structure of the present invention is shown, generally designated as 10. For illustrative purposes, the structure 10 will be described below in relationship to a semiconductor device 10. Although the structure 10 is also referred to herein as the semiconductor device 10, those having ordinary skill in the art will appreciate that the invention applies more generally to the formation on a substrate of a feature including a critical dimension (CD), e.g., a lateral dimension, less than the CD achievable at the resolution limit of lithography in one region and a feature including a CD that is achievable at the resolution limit of lithography in another region. Further, a sidewall spacer may be formed on one of the features during the process from a mask layer used in the process.

The semiconductor device 13 includes a substrate 12, including a first region 14 and a second region 16 The substrate 12 also includes an active region in a surface region of the substrate (not shown), e.g., a p-type region. Over the substrate 12, a layer 18, including a line and space pattern 20, is formed. A dielectric layer 22 is interposed between the layer 18 and the substrate 12.

In the first region 14, the line and space pattern 20 includes gate electrodes 18a and 18b and space(s) 24. In the second region 16, there are gate electrodes 18c and 18d and space(s) 26. The space(s) 24 between the gates 18a and 18b in the first region 14 includes a dimension A that is less than a minimum dimension achievable by a resolution limit of lithography. The gates 18c and 18d in the second region 16 include a dimension B that is the minimum dimension achievable at a resolution limit of lithography. The dimension B is and dictated by a device parameter. Additionally, sidewall spacers 28a are formed on sidewalls 30 of the gate electrodes 18c and 18d from a conformal second hard mask layer 28 (not shown) as further described below.

The semiconductor device 10 may include gates comprising conventional gate stack structures. For example, a SONOS gate structure is illustrated in the first region 14. The SONOS gate structure includes a dielectric layer 22a, e.g., an oxide-nitride-oxide (ONO) layer, interposed between the gate electrodes 18a and 18b and the substrate 12. A MOSFET structure is illustrated in the second region 16. The MOSFET structure includes a dielectric layer 22b interposed between the gate electrodes 18c and 18d and the substrate 12. Alternatively, a floating gate structure, including a dielectric layer, a charge-rapping layer, an ONO layer and a control gate may be formed (not shown).

The layer 18 may be of a conductor, a semiconductor, or an insulator material or a combination thereof as will be further described below. In one embodiment, for example, the layer 18 is polysilicon. The layer 18 may have a thickness of between about 5 nm and about 200 nm. The layer 18 is illustrated in FIG. 1 as a single layer, however, the layer 18 could be multiple layers.

The dielectric layer 22a in the first region 14 may also be referred to herein as a charge-trapping dielectric layer 22a. The charge-trapping dielectric layer 22a may include a tunneling layer 32, a charge-trapping layer 34 and/or an insulating layer 36. The tunneling layer 32 is interposed between the charge-trapping layer 34 and the substrate 12. The charge-trapping layer 34 is interposed between the insulating layer 36 and the tunneling layer 32. The insulating layer 36 is interposed between the layer 18 and the charge-trapping layer 34.

The tunneling layer 32, the charge-trapping layer 34 and the insulating layer 36 may be an ONO layer. Alternatively, the tunneling layer 32 and/or the insulating layer 36 may be of a high-K material as will be further described below. The dielectric layer 22a may have a thickness of between about 1 nm and about 10 nm.

In one embodiment, the dielectric layer 22a may have a thickness of, for example, between about 2 nm and about 8 nm. In another embodiment, the dielectric layer 22a may have a thickness of, for example, between about 3 nm and about 7 nm. It should be understood by those having ordinary skill in the art that the above thicknesses are merely exemplary and that the thicknesses may be combined, for example, from about 1 nm to about 7 nm, or about 2 nm to about 10 nm, or about 2 nm to about 7 nm or the like.

The dielectric layer 22b in the second region 16 may also be referred to herein as a gate dielectric layer 22b. The gate dielectric layer 22b may comprise a single layer or multiple layers. Further, the gate dielectric layer 22b may be of conventional dielectric material or of a high-K material as will be further described below. The dielectric layer 22b may have a thickness of between about 1 nm and about 10 nm.

In one embodiment, the dielectric layer 22b may have a thickness of, for example, between about 2 nm and about 8 nm. In another embodiment, the dielectric layer 22b may have a thickness of, for example, between about 3 nm and about 7 nm. It should be understood by those having ordinary skill in the art that the above thicknesses are merely exemplary and that the thicknesses may be combined, for example, from about 1 nm to about 7 nm, or about 2 nm to about 10 nm, or about 2 nm to about 7 nm or the like.

The substrate 12 may be of a conductor, a semiconductor, or an insulator material or a combination thereof, as will be further described below. The substrate 12 may have a thickness of between about 50 nm and about 2,000 nm.

The sidewall spacers 28a may be of a hard mask material further described below. In one embodiment, the sidewall spacers 28a are of a HTO, for example. The sidewall spacers 28a may have a thickness between about 5 nm and about 50 nm and a height between about 5 nm and about 150 nm. The sidewall spacers 28a are illustrated in FIG. 1 as a homogeneous composition, however, the sidewall spacers 28a could comprise multiple layers or have a graded composition.

Although the illustrated device is a semiconductor device comprising a layer patterned with varying pitch and at least two critical dimensions, other devices can also be improved using the method to pattern a layer on a substrate, including variable pitch and at least two critical dimensions, as further described herein.

Further, the method forms a semiconductor device 10 which saves processing steps by using one critical masking step and two non-critical masking steps in the formation of the line and space pattern 20 in the layer 18. The method also forms a multi-use spacer 28a from a hard mask layer used in the formation of a master hard mask used in the patterning of the layer 18, for example. That is, the simultaneous masking of the core and periphery gates, e.g., polysilicon layer, using the single critical mask eliminates the need to reduce a printed periphery critical dimension in order to account for a hard mask spacer formed on a hard mask in a conventional process. Additionally, the single process for forming the small core space(s) and the periphery spacer saves processing steps. For example, the periphery spacer may be used as an implant spacer. Additionally, very small spaces can be formed in the core region without the use of lithography to print the very small spaces. Also, the method extends the use of current lithography apparatuses. Thus, core and periphery gates with faster operating speeds may be achieved. Further, the cost of manufacturing the semiconductor device can be reduced.

Figure 9:
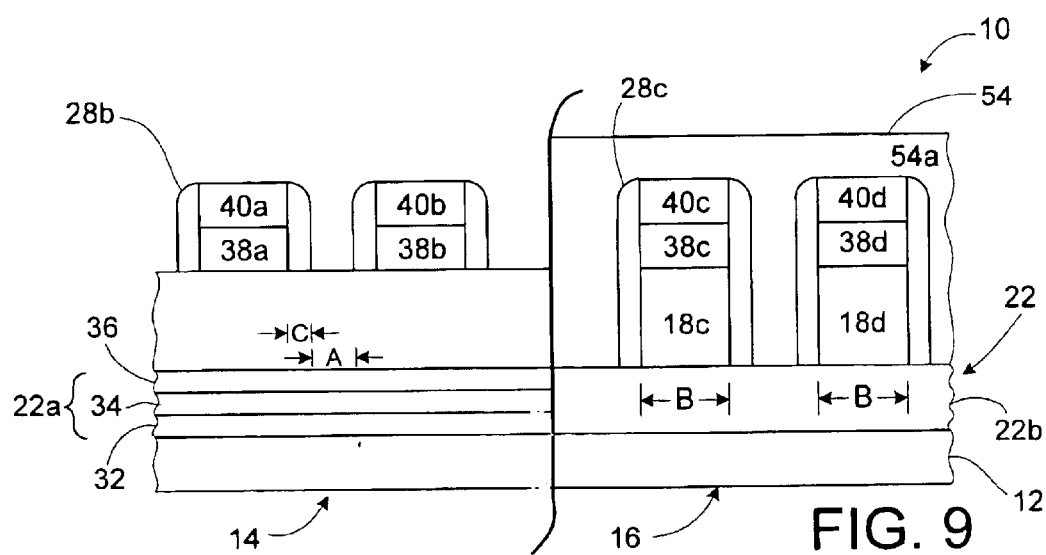
Figure 10:
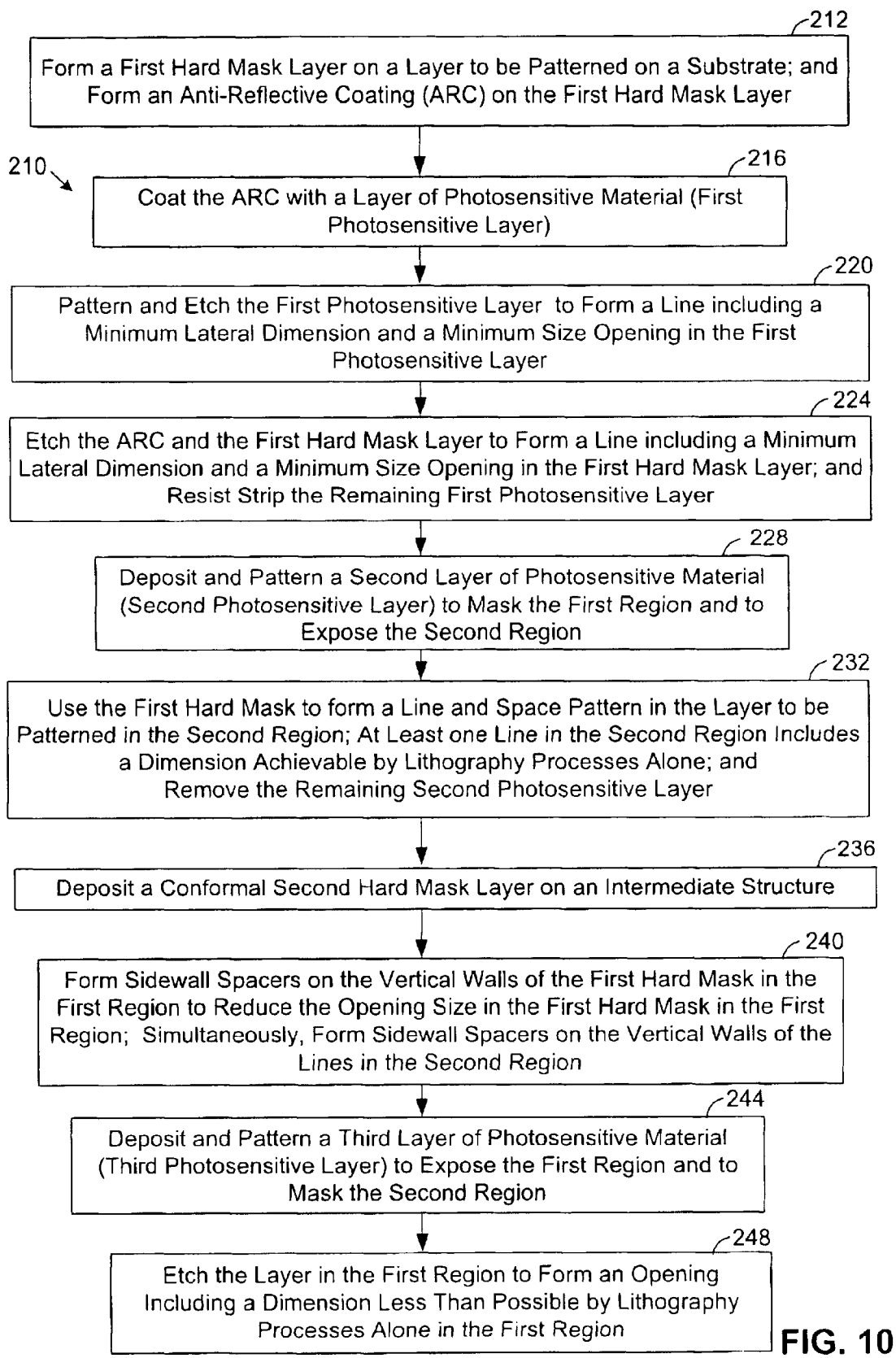
FIG. 10 is a flow diagram of a method of manufacturing the layer according to the present invention.

The steps of a method 210 for fabricating a semiconductor device 10 are outlined in the flow chart shown in FIG. 10. FIGS. 2–9 illustrate various steps of the method 210. It will be appreciated that the method 210 and the semiconductor device 10 described below are merely exemplary and that suitable embodiments of the many below described variations in materials, thicknesses, and/or structures may alternatively be used in the method 210 and/or the semiconductor device 10.

Figure 2:
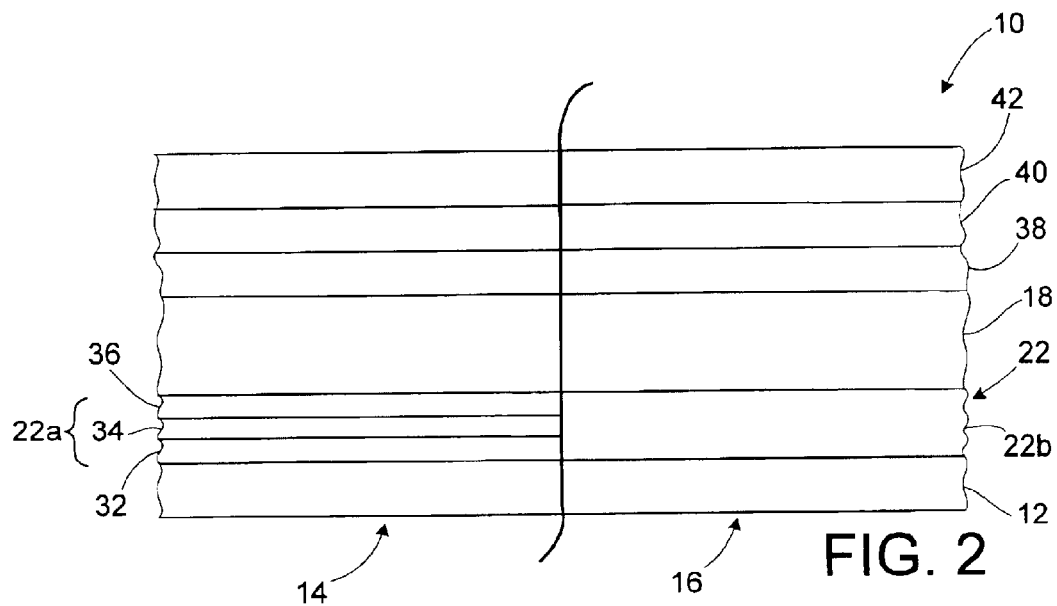
FIGS. 2–9 are sequential cross-sections of a method of manufacturing the layer according to the present invention at intermediate stages of manufacture.

In Step 212, as represented in FIG. 2, a structure 10 representing an intermediate step of the manufacturing process is shown. The method 210 is initiated with a substrate 12. The substrate 12 may be of any substrate material. For example, the substrate 12 may be a conductor, a semiconductor, a compound semiconductor or an insulator material, for example, metal, silicon, GaAs, InGaAs, silicon oxide, glass, photosensitive material or a combination thereof. Further, the substrate 12 may include at least one of silicon, germanium, silicon-germanium alloys, silicon-carbon alloys, silicon-germanium alloys containing carbon, and other conductive and semi-conductive materials; the aforementioned materials implanted with any element; the aforementioned materials in layered or graded composition combinations; the aforementioned materials in porous; amorphous, single crystal, polycrystalline, nanocrystalline form; and mixtures thereof.

A substrate 12 of a semiconductor material may be a bulk substrate, a composite semiconductor substrate or the like. The composite semiconductor substrate may be a semiconductor-on-insulator (SOI), a silicon-on-insulator, a germanium-on-insulator (GOI) or the like. The composite semiconductor substrate may comprise a support substrate, an insulating layer (hereinafter referred to as the buried insulating layer) formed on the support substrate and a surface semiconductor layer formed on the buried insulating layer. The support substrate may be of one of the materials described above.

The buried insulating layer may comprise sapphire, quartz, glass, plastic, or the like. For example, the buried insulating layer may be silicon oxide ($Si_xO_y$). Additionally, the buried insulating layer may be a nitride layer, for example, silicon oxynitride (SiON), silicon nitride (SiN) or the like. The buried insulating layer may also be an undoped polysilicon. Further, the buried insulating layer may be of a material having a permittivity greater than a permittivity of silicon dioxide ($SiO_2$), i.e., about 3.9.

Permittivity, C, of a material reflects the ability of the material to be polarized by an electric field. The permittivity of a material is typically described as its permittivity normalized to the permittivity of a vacuum, $\epsilon_o$. Hence, the relative permittivity, referred to as a dielectric constant, of a material is defined as:

$$K=\epsilon/\epsilon_0.$$

While silicon-dioxide ($SiO_2$) (sometimes simply referred to as "oxide") has a dielectric constant of approximately 3.9, other materials have higher K values. For example, aluminum oxide ($Al_2O_3$) has a K of about 9 to about 10. Much higher K values of, for example, 20 or more, can be obtained with various transition metal oxides, including tantalum oxide ($Ta_2O_5$), hafnium oxide ($HfO_2$) and zirconium oxide ($ZrO_2$).

Using a dielectric material, including a higher K for the gate dielectric, allows a high capacitance and an electrical equivalent thickness of a thinner silicon-dioxide ($SiO_2$) gate dielectric layer to be achieved while maintaining or increasing the physical thickness of the gate dielectric. For example, an aluminum oxide ($Al_2O_3$) layer including a K of 9.6 and a physical thickness of 6.25 nm is substantially electrically equivalent to a silicon oxide (e.g., silicon-dioxide ($SiO_2$)) layer including a K of 3.9 and a physical thickness of 2.5 nm. Therefore, the gate dielectric can be made electrically thin while being formed of a physically thicker layer compared to a conventional $SiO_2$ gate dielectric layer.

Examples of dielectric material, including a high K, include the following: aluminum oxide ($Al_2O_3$), hafnium oxide ($HfO_2$), zirconium oxide ($ZrO_2$), zirconium oxide (ZrO), titanium oxide (TiO), yttrium oxide (YO), zirconium silicate, hafnium silicate, lanthanum oxide ($La_2O_3$), cerium oxide ($CeO_2$), bismuth silicon oxide ($Bi_4Si_2O_{12}$), tantalum oxide ($Ta_2O_5$), tungsten oxide ($WO_3$), $LaAlO_3$, BST ($Ba_{1-x}Sr_xTiO_3$), $PbTiO_3$, $BaTiO_3$, $SiTiO_3$, $PbZrO_3$, PST ($PbSc_xTa_{1-x}O_3$), PZN ($PbZn_xNb_{1-x}O_3$), PZT ($PbZr_xTi_{1-x}O_3$), PMN ($PbMg_xNb_{1-x}O_3$) or the like. Additionally, the insulating layer may comprise other binary and tertiary metal oxides and ferro electric material including a dielectric constant greater than silicon dioxide ($SiO_2$).

The buried insulating layer may have a thickness between about 10 nm to about 100 nm thick, for example. The thickness of the buried insulating layer may be adjusted in consideration of the characteristics of a semiconductor device 10 to be realized, for example, the magnitude of the voltage to be applied when the realized semiconductor device 10 is used.

The surface semiconductor layer functions as an active layer for forming the semiconductor device 10. The surface semiconductor layer may be made of a semiconductor material, such as silicon, germanium or the like; or a compound semiconductor such as silicon-germanium (SiGe), GaAs, InGaAs, or the like, or mixtures thereof. The surface semiconductor layer may be in a single crystal, polycrystalline or nanocrystalline form.

The thickness of the surface semiconductor layer can be adjusted in consideration of the characteristics of the semiconductor device 10 to be realized, varying parameters, for example, the junction depth of the source and drain regions of a semiconductor device 10 described below, the depth of the channel region within the surface semiconductor layer, or the like. The surface semiconductor layer may have a thickness between about 1 nm to about 100 nm, for example.

For exemplary purposes, the substrate 12 is a semiconductor substrate. The semiconductor substrate 12 has a thickness of between about 50 nm and about 2,000 nm.

Over the substrate 12, a dielectric layer 22 of one or more layers is formed, grown, deposited, spin coated or the like, or a combination thereof, on the semiconductor substrate 12 using known techniques. For example, a PVD, a PECVD or a CVD process appropriate for the layer being deposited may be used to apply the dielectric layer 22. For illustrative purposes, the dielectric layer 22 includes a charge-trapping dielectric layer 22a formed over the first region 14 and a gate dielectric layer 22b formed over the second region 16. The charge-trapping dielectric layer 22a includes a tunneling layer 32, a charge-trapping layer 34 and an insulating layer 36. Each sub-layer will be deposited to a thickness according to a desired device parameter for a semiconductor device 10 to be realized. It should be understood by those having ordinary skill in the art that the charge-trapping dielectric layer 22a may comprise only two layers, e.g., the tunneling layer 32 and the charge-trapping layer 34. The gate dielectric layer 22b is illustrated as a single layer; however, it may be comprised of multiple layers.

The tunneling layer 32 and the insulating layer 36 may be of a conventional dielectric material, e.g., $Si_xO_y$ or of a high-K dielectric material, as further described above. The charge-trapping layer 34 may be of any material that is compatible with the first and second dielectric layers and is capable of storing a charge. The charge-trapping layer 34 may be a nitride, e.g., silicon nitride, silicon oxynitride or the like.

The dielectric layer 22 may have a thickness of between, for example, about 1 nm and about 25 nm.

Next, the layer 18 is formed, grown, deposited, spin coated or the like, or a combination thereof, on the dielectric layer 22 using known techniques. For example, the layer 18 may be deposited over the dielectric layer 22 by CVD, PECVD, atomic layer deposition (ALD) or the like. The layer 18 may be a single layer or multiple layers.

The layer 18 may be of any material desired to be patterned. For example, the layer 18 may be of non-conductive material, conductive material, semi-conductive material, dielectric material or a combination thereof. The layer 18, for example, comprises at least one of silicon, germanium, silicon-germanium alloys, silicon-carbon alloys, silicon-germanium alloys containing carbon, GaAs, InGaAs, and other conductive and semi-conductive materials; silicon oxide ($Si_xO_y$), silicon-dioxide ($SiO_2$), aluminum oxide ($Al_2O_3$), hafnium oxide (HfO), zirconium oxide (ZrO), titanium oxide (TiO), yttrium oxide (YO), lanthanum oxide ($La_2O_3$), cerium oxide ($CeO_2$), bismuth silicon oxide ($Bi_4Si_2O_{12}$), tantalum oxide ($Ta_2O_5$), tungsten oxide ($WO_3$), $LaAlO_3$, BST ($Ba_{1-x}Sr_xTiO_3$), $PbTiO_3$, $BaTiO_3$, $SiTiO_3$, $PbZrO_3$, PST ($PbSc_xTa_{1-x}O_3$), PZN ($PbZn_xNb_{1-x}O_3$), PZT ($PbZr_xTi_{1-x}O_3$), PMN ($PbMg_xNb_{1-x}O_3$), binary and tertiary metal oxides, other metal oxides; silicon nitride ($Si_xN_y$), silicon oxynitride ($SiO_xN_y$), other nitrides; zirconium silicate, hafnium silicate, other silicates; ferro electric material; silicide of a metal having a high melting point such as W, Ta, Ti, Mo or the like; polycide made of the suicide (for example, $MoSi_2$, $WSi_2$) and polysilicon; and the other metals; the aforementioned materials implanted with any element; the aforementioned materials in layered or graded composition combinations; the aforementioned materials in porous, amorphous, single crystal, polycrystalline, or nanocrystalline form; and mixtures thereof. Further, the layer 18 may be of a material including a permittivity greater than a permittivity of silicon dioxide ($SiO_2$), i.e., about 3.9, as further described above.

For exemplary purposes, the layer 18 is a single layer of polysilicon. The polysilicon may be deposited on the substrate 12 using a PECVD process. The layer 18 may have a thickness of, for example, between about 5 nm to about 150 nm thick.

After forming the layer 18, a first hard mask layer 38 is formed, grown, deposited, spin coated or the like, or a combination thereof, on the layer 18 again using conventional techniques. For example, the first hard mask layer 38 may be thermally grown by conventional techniques. Alternatively, the first hard mask layer 38 may be deposited also using conventional techniques. Further, the first hard mask layer 38 may be formed using a combination of the above, e.g., a thin oxide layer may be thermally grown to form a good interface and then an oxide of lesser quality may be deposited thereon.

The first hard mask layer 38 may be of any known mask material. For example, the first hard mask layer material may also comprise at least one of silicon oxide, $Si_xO_y$, silicon-dioxide ($SiO_2$), other oxides; silicon nitride ($Si_xN_y$), silicon rich nitride, oxygen rich nitride, other nitrides; the aforementioned materials implanted with any element; the aforementioned materials in layered or graded composition combinations; the aforementioned materials in porous, amorphous or nanocrystalline form; and mixtures thereof.

For illustrative purposes, the first hard mask layer 38 is formed of a high temperature oxide material (HTO). The first hard mask layer 38 may have a thickness of between about 5 nm and about 150 nm, for example.

Next, an anti-reflective coating (ARC) 40 is applied. The ARC 40 is optional. However, the ARC 40 is used when increased resolution of the lithography process is required. The ARC 40 material may also comprise at least one of silicon oxide, $Si_xO_y$, silicon-dioxide ($SiO_2$), silicon rich oxide (SiRO), other oxides; silicon nitride ($Si_xN_y$), SiRN, oxygen rich nitride, other nitrides; silicon carbide ($Si_xC_y$), other carbides; amorphous carbon, spin on organic ARC material; the aforementioned materials implanted with any element; the aforementioned materials in layered or graded composition combinations; the aforementioned materials in porous, amorphous or nanocrystalline form; and mixtures thereof.

For illustrative purposes, the ARC 40 comprises silicon rich nitride (SiRN) applied, for example, by CVD. The ARC 40 may have a thickness in the range of about 30 nm to about 50 nm, for example.

Next in Step 216, a first photosensitive layer 42 of a photosensitive material is applied over the ARC 40, for example, by spin-coating. The first photosensitive layer 42 may have a thickness in the range of about 30 nm to about 50 nm, for example. The first photosensitive layer 42 is a photoresist selective to the first hard mask layer 38 or the ARC 40, if an ARC is used. That is, the photoresist is compatible with the first hard mask layer 38 and when processed, can be used as an etch mask to etch a lithographic image into the first hard mask layer 38.

Figure 3:
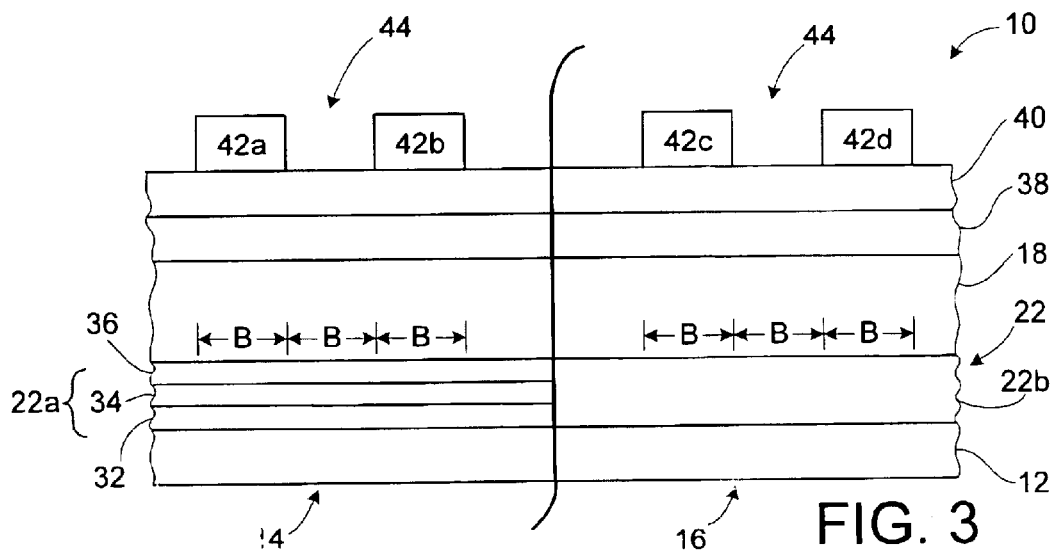

Then, in Step 220, as illustrated in FIG. 3, the first photosensitive layer 42 is patterned, i.e., patterned to form a first lithographic image, by pattern-exposing using a conventional lithographic tool, developed, rinsed and dried. The pattern includes sub-first photosensitive layers 42a–42d. Next, an anisotropic etching is conducted to form an opening (s) 44, referred to herein as spaces, in the first photosensitive layer 42 according to the pattern. For simplicity of illustration in FIG. 3, only two openings 44 and four lines are shown. Two lines, i.e., a sub-first photosensitive layer 42a and a sub-first photosensitive layer 42b, are illustrated in the first region 14. The two lines, i.e., sub-first photosensitive layer 42c and a sub-first photosensitive layer 42d, are shown in the second region 16. The four lines 42a–42d include substantially vertical surfaces.

The opening 44 includes a lateral dimension B between the two lines 42a and 42b, as well as, the two lines 42c and 42d. The dimension B represents, for example, the minimum dimension that is obtainable at the resolution limit of the lithography process utilized in Step 220. That is, the dimension B may be the smallest dimension that is achievable by pushing known lithography (including x-ray, electron-beam or the like) to its highest resolution limit. This is considered the only critical masking step.

Next, the patterned sub-first photosensitive layers 42a–42d are subjected to a hardening process step to thermally stabilize the patterned sub-first photosensitive layers 42a–42d. Deep ultraviolet exposure or heat treatment at a temperature of about 200° C. to about 250° C. for about 1–2 minutes may be used for hardening. Alternatively, the patterned sub-first photosensitive layers 42a–42d may be hardened by subjecting the patterned sub-first photosensitive layers 42a–42d to a halogen gas plasma. The hardening step is needed for conventional photoresists, lest the photosensitive material constituting the patterned sub-first photosensitive layers 42a–42d may melt and flow or otherwise get degraded during the subsequent processes. The hardening of the photoresistant material may not be required for photoresistant material including a higher melting point as will be understood by those having ordinary skill in the art.

Figure 4:
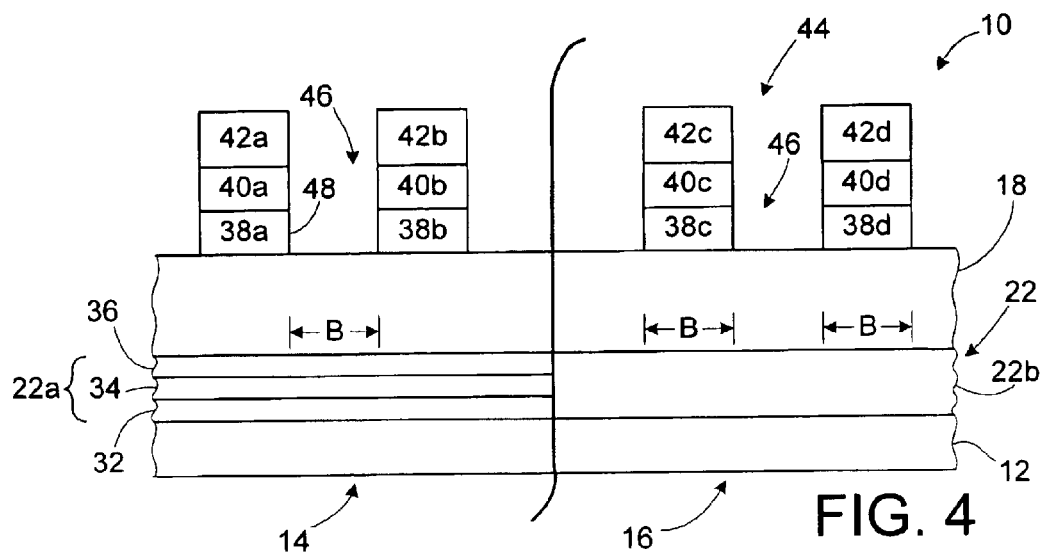

Next, in Step 224, as illustrated in FIG. 4, an anisotropic etch is conducted to transfer the lithographic image of the patterned sub-first photosensitive layers 42a–42d to the first hard mask layer 38. An etchant removes the ARC 40 exposed by the openings 44. Further, the etchant removes the first hard mask layer 38 beneath the exposed ARC 40. The etch step leaves openings 46, including the lateral dimension B, in the patterned first hard mask layer 38. In one embodiment, the line/space ratio may be, for example, from about 0.07 $\mu$m/0.09 $\mu$m. In another embodiment, the line/space ratio may be, for example, from about 0.10 $\mu$m/0.15 $\mu$m. In another embodiment, the line/space ratio may be, for example, from about 0.12 $\mu$m/0.19 $\mu$m. In other words, for a specific pitch, e.g., 160 nm, 250 nm or 310 nm, a line is about 40% of the pitch.

The resultant structure includes a first vertical stack and a second vertical stack in the first region 14 and a third vertical stack and a fourth vertical stack in the second region 16. The first vertical stack includes a sub-first hard mask layer 38a, a sub-ARC layer 40a and a sub-first photosensitive layer 42a. The second vertical stack includes a sub-first hard mask layer 38b, a sub-ARC layer 40b and a sub-photosensitive layer 42b. The third vertical stack includes a sub-first hard mask layer 38c, a sub-ARC layer 40c and a sub-first photosensitive layer 42c. The fourth vertical stack includes a sub-first hard mask layer 38d, a sub-ARC layer 40d and a sub-first photosensitive layer 42d.

Openings 46 formed in the first hard mask layer 38 as a result of the transfer include substantially vertical surfaces 48. A subsequent anisotropic etching removes the remaining photosensitive material of the first photosensitive layer 42, i.e., the sub-first photosensitive layers 42a–42d. Thus, the lithographic image is transferred from the patterned first photosensitive layer 42 to the first hard mask layer 38. That is, the first hard mask is formed.

Figure 5:
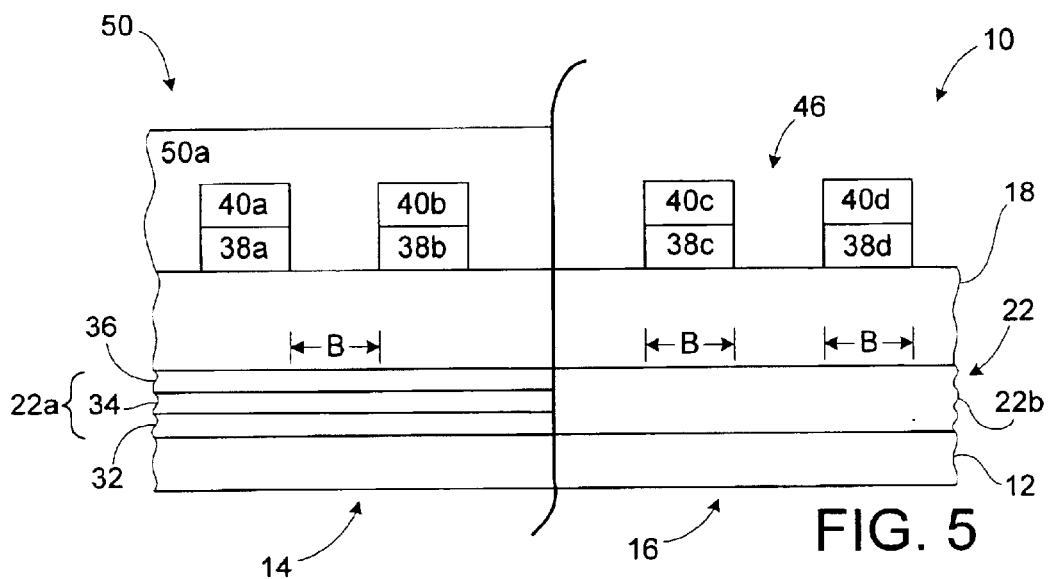
Figure 6:
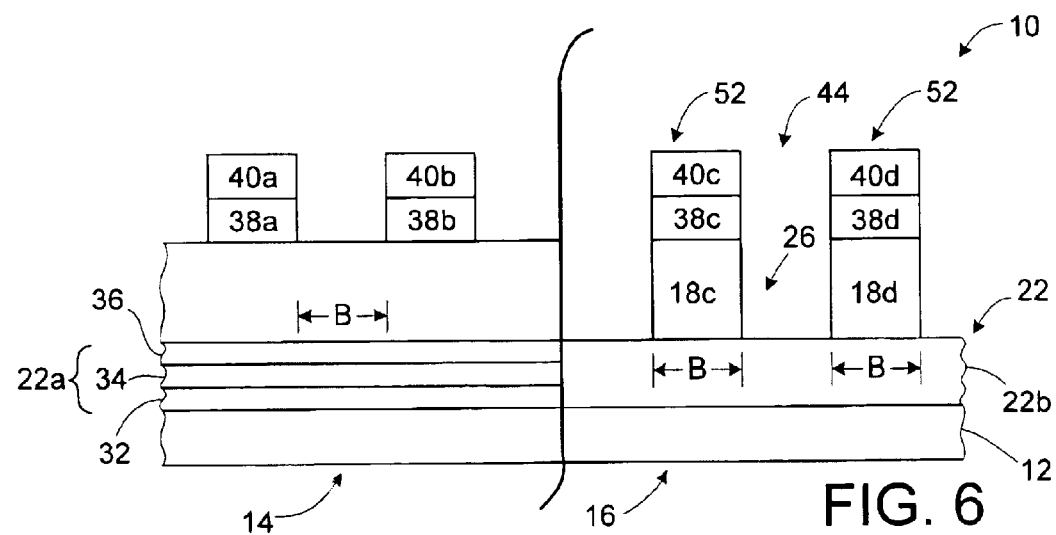

In the next two steps (i.e., Steps 228 and 232), as illustrated in FIGS. 5–6, the pattern of the first hard mask layer 38 in the second region 16, i.e., sub-first hard mask layer 38c and 38d, are transferred to the layer 18 to form lines 18c and 18d, i.e., gate electrodes 18c and 18d. The gate electrodes 18c and 18d include a lateral dimension achievable at the resolution limit of lithography.

First in Step 228, a second photosensitive layer, generally designated 50, of a photosensitive material is applied, for example, by spin-coating. The second photosensitive layer 50 may be of the same or different material as the first photosensitive layer 42. The second photosensitive layer 50 may have a thickness in the range of about 30 nm to about 50 nm, for example.

Referring now to FIG. 5, the second photosensitive layer 50 is patterned by pattern-exposing using a conventional lithographic tool, developed, rinsed and dried as described above. That is, the second photosensitive layer 50 is patterned to form a protective mask over the first region 14, i.e., a sub-second photosensitive layer 50a, and to expose the second region 16 by removing a portion of the second photosensitive layer 50 over the second region 16.

This is considered a first non-critical masking step. If the second photosensitive layer 50 requires a hardening process, then the second photosensitive layer 50 may be hardened using the processes described above. Following the removal of the second photosensitive layer 50 over the second region 16, in Step 232, the first hard mask can be used to transfer the second master line and space sub-pattern in the second region 16 to the layer 18 in the second region 16. That is, an anisotropic etching is conducted to form an opening in the second region 16 in the layer 18 exposed by the opening 46 in the hard mask layer 38. Thus, lines 18c and 18d are formed in the second region 16 as illustrated in FIG. 6. Next, an anisotropic etching is performed to remove the remaining portions of the second photosensitive layer 50.

The resultant structure is shown in FIG. 6. The resultant structure includes a fifth vertical stack and a sixth vertical stack in the second region 16. The fifth vertical stack includes the gate electrode 18c, a sub-first hard mask layer 38c and a sub-ARC layer 40c. The sixth vertical stack includes the gate electrode 18d, a sub-first hard mask layer 38d and a sub-ARC layer 40d. The fifth vertical stack and the sixth vertical stack hereinafter may also be referred to as lines 52.

Lines 52 comprising the fifth and sixth vertical stacks include the lateral dimension B. The lines 52 have substantially vertical surfaces. The dimension B is the dimension dictated by device requirements and achievable at the resolution limit of lithography.

Figure 7:
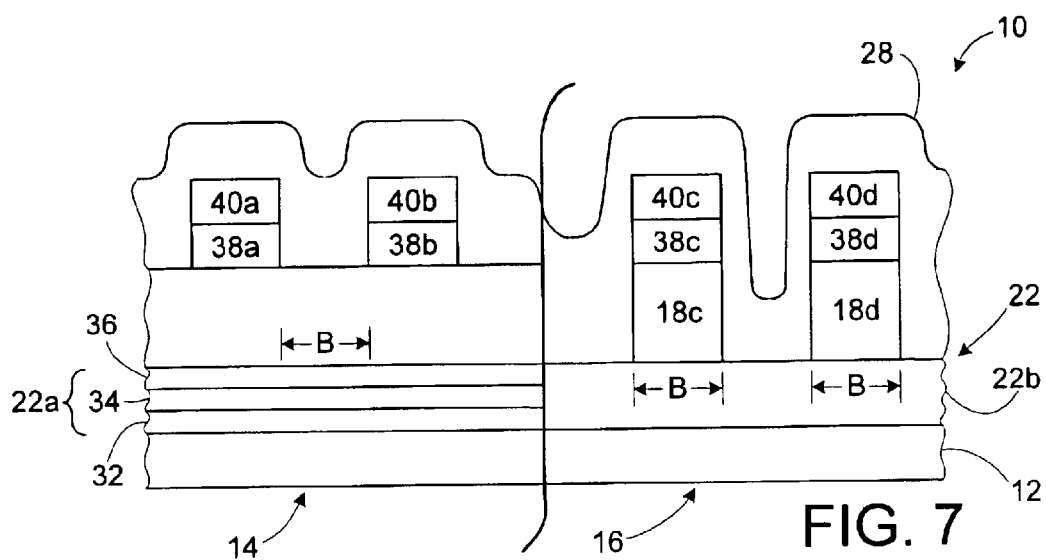

Referring now to Step 236, FIG. 7, sidewall spacers are formed on the vertical surfaces 48 of the sub-first hard mask layers 38a and 38b and the sub-ARC layers 40a and 40b in the first region 14 to reduce by a lateral dimension C (FIG. 8) the openings 46 (FIG. 5). Additionally, sidewall spacers are formed on the vertical surfaces of the lines 52 in the second region 16 to produce transistor spacers, implant spacers or the like.

The conformal second hard mask layer 28 may be any material that can be deposited on the intermediate structure. Examples of conformal second hard mask layer material include the materials described above associated with the first hard mask layer 38. In a particular embodiment, the conformal second hard mask layer 28 may be of the same material as the first hard mask layer 38. In one embodiment, the conformal second hard mask layer 28 is $Si_xO_y$, obtained by hexamethyldisilazane (HMDS) plasma deposition.

Typically, the conformal second hard mask layer 28 is formed by mounting the substrate 12 in a plasma deposition system. Then, liquid HMDS is introduced into the process chamber and the necessary electric field is generated therein which transforms the liquid HMDS into a HMDS plasma. The HMDS plasma will be deposited on the structure until a uniform conformal second hard mask layer 28 of plasma-deposited HMDS, including the composition $Si_xO_y$, is obtained.

The thickness of the conformal second hard mask layer 28 is determined by the desired reduction in the lithographic image size in the first hard mask layer 38 in the first region 14. Typically, for very large scale integrated circuit fabrication, the thickness of the conformal second hard mask layer 28 is in a range of about 3 nm to about 500 nm. Alternatively, the thickness may be in a range of about 10 nm to about 100 nm. Further still, the thickness may be in a range of about 30 nm to about 50 nm. It should be understood by those having ordinary skill in the art that the above thicknesses are merely exemplary and that the thicknesses may be combined, for example, from about 3 nm to about 50 nm, or about 10 nm to about 30 nm, or about 30 nm to about 100 nm or the like.

The lower limit for the thickness of the conformal second hard mask layer 28 is dictated by the requirements of good step coverage associated with the substantially vertical wall profile in the first hard mask layer 38, including the ARC 40, and the viability of the conformal second hard mask layer 28 as a thin layer. The upper limit for the thickness of the conformal second hard mask layer 28 is determined by the desired percentage reduction in the size of the opening 46 in the first hard mask layer 38.

The percentage reduction in the opening dimension is governed by the factor 2E/D. In other words, if the dimension of the opening is 15 nm, in order to achieve a 66.6% reduction in the dimension of the openings 46 (or an actual reduction of the opening dimension to about 5 nm), a 5 nm thick conformal second hard mask layer 28 is deposited.

Next, in Step 240, the conformal second hard mask layer 28 is anisotropically etched to remove it from all the substantially horizontal surfaces of the sub-ARC layers 40a–40d and portions of the layer 18 leaving it only on the substantially vertical surfaces of the sub-first hard mask layers 38a–38d, the sub-ARC layers 40a–40d and the lines 18c and 18d. Next, an optional ARC strip is done to remove the remaining ARC 40 (sub-ARC 40a–40d) in both the first region 14 and the second region 16.

Figure 8:
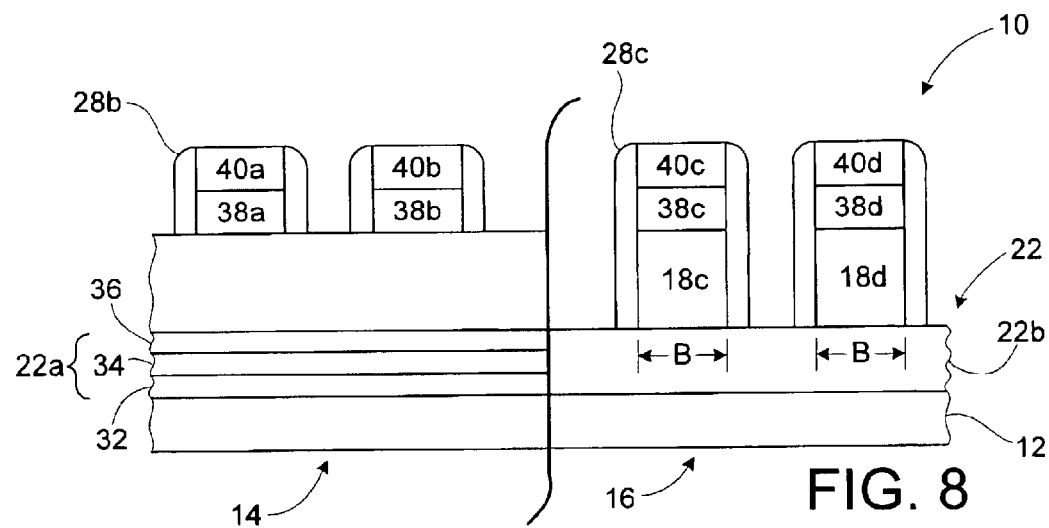

The resulting structure will be as shown in FIG. 8 where the unetched portions of the conformal second hard mask layer 28 now serve as sidewall spacers 28b on the vertical surfaces 48 of the sub-first hard mask layers 38a–38b in the first region 14. In the second region 16, the sidewall spacers 28c are formed on the fifth and sixth vertical stacks. Due to the establishment of the sidewall spacers 28b on the vertical surfaces 48, new openings 46a are formed to include the dimension A. The relationship between the parameters A, B (shown in FIG. 3) and C is given by:

$$A = B - 2C.$$

Thus, a master hard mask comprising the patterned first hard mask layer 38 and the sidewall spacers 28b is formed. Over the first region, the hard mask includes a first master line and space sub-pattern including at least one space comprising a first critical dimension less than a minimum dimension achievable at a resolution limit of lithography. Over the second region, the hard mask includes a second master line and space sub-pattern including at least one line comprising a second critical dimension. The second critical dimension is achievable at a resolution limit of lithography.

Next in Step 244, a third photosensitive layer, generally designated 54, of a photosensitive material is applied, for example, by spin-coating. The third photosensitive layer 54 may be of the same or different material as the first and second photosensitive layers 42 and 50. The third photosensitive layer 54 may have a thickness in the range of about 30 nm to about 500 nm, for example.

Referring now to FIG. 9, the third photosensitive layer 54 is patterned (i.e., to form sub-third photosensitive layer 54a) by pattern-exposing using a conventional lithographic tool, developed, rinsed and dried as described above. An anisotropic etching is conducted to remove the third photosensitive layer 54 over the first region 14. This is considered a second non-critical masking step. If the third photosensitive layer 54 requires a hardening process, then the third photosensitive layer 54 may be hardened using the process described above.

Next in Step 248, portions of the layer 18 exposed by the reduced-sized openings 46a in the first region 14 are removed by an RIE. Lines 18a and 18b are formed as a result. After the lines 18a and 18b are formed, an anisotropic etching is performed to remove the remaining photosensitive material of the third photosensitive layer 54. The RIE etchant used may be, for example, an etchant species selective to facilitate the removal of the exposed layer 18 while leaving the hard mask.

Alternatively, the etchant used may be $O_2$ plasma.

The master hard mask, comprising the first hard mask including the sidewall spacers 28b in the first region 14, fabricated in this manner, constitutes a new mask (or stencil) for forming spaces including a dimension less than achievable by lithography processes alone in the first region 14. Further, the new mask includes sub-first hard mask layers 38d and 38e and sidewall spacers 28c in the second region 16. The sub-first hard mask layers 38d and 38e include a dimension achievable at a resolution limit of lithography.

The resultant structure includes a seventh and an eighth vertical stack in the first region 14. The seventh and eighth vertical stacks include the gate electrode 18a, a sub-first hard mask layer 38a and a sub-ARC layer 40a. The eighth vertical stack includes the gate electrode 18b, a sub-first hard mask layer 38b and a sub-ARC layer 40b. The seventh vertical stack and the eighth vertical stack include a space 24 therebetween.

The space 24 includes the lateral dimension A. The dimension A is a dimension less than achievable at the resolution limit of lithography.

In one embodiment, the line/space ratio in the first region 14 may be, for example, 0.11 μm/0.05 μm. In another embodiment, the line/space ratio in the first region 14 may be, for example, 0.15 μm/0.10 μm. In another embodiment, the line/space ratio in the first region 14 may be, for example, 0.17 μm 10.14 μm. The line/space ratio in the second region 16 will be the line/space ratio formed in Step 228.

The new mask may serve a variety of purposes. For example, it may be used as an ion implantation mask to implant an extremely narrow/small region of the substrate 12. Another application of the new mask is as an etch mask to etch extremely narrow deep/shallow trenches in the substrate 12. Yet another application is to grow a recessed isolation oxide free of bird's beak and bird's head of a width essentially equal to the dimension of the opening by subjecting the substrate 12 and the overlying stencil structure to a low temperature oxidation. A further use of the new mask is as a contact (liftoff) mask for establishing highly localized electrical contacts to the substrate 12.

After the new mask is used for its intended purpose, the new mask may be removed from the layer 18 by subjecting the new mask to a wet or dry etchant, for example, a hot oxidizing acid such as nitric acid, sulphuric acid, hot phosphoric acid or a hot phenol. Alternatively, the new mask may be removed concurrently by oxygen plasma.

Any sidewall spacer material that remains in the first region 14 may be removed by mechanical means, a plasma etch or washed off in a liquid base. The sidewall spacers 28c are reduced accordingly to form the sidewall spacers 28a as illustrated as FIG. 1.

Next, the semiconductor device 10 may be completed using conventional techniques known by those having ordinary skill in the art (not shown). For example, a spacer(s) may be formed on a sidewall(s) of the gate electrodes 18a and 18b. Further, additional spacers may be formed on the sidewalls of the gate electrodes 18c and 18d. The spacer(s) may be of an insulating film in consideration of the diffusion of the impurities in the lateral direction when forming source and drain regions. Additionally, the semiconductor device 10, may be isolated from other devices on the substrate 12 by a LOCal Oxidation of Silicon (LOCOS) oxide film or a trench device isolation film (shallow trench isolation, i.e., STI) or the like.

INDUSTRIAL APPLICABILITY

The exemplary semiconductor device 10 formed by the process described above includes a first region 14, wherein gates are formed in a core region including a space comprising a dimension less than achievable by a resolution limit of lithography processes alone. The space is formed by increasing a lateral dimension of the gates in the core region. Further, gates formed in the second region 16 include a lateral dimension achievable at the resolution limit of lithography. The semiconductor device 10 is achieved by independently masking the core and periphery gates. The independent masking allows for optimization of lithography processes, i.e., illumination conditions and etching processes, required to define the polysilicon to include varying pitch and at least two critical dimensions. The formation of sidewall spacers on a hard mask in the core region allows the core polysilicon to be defined to include sub-lithographic spacing. The formation of sidewall spacers on the gate electrodes in the periphery reduces the number of steps in the manufacturing process. Further, the independent masking of the core and periphery regions allow for the use of different illumination conditions for both. Additionally, the formation of a single hard mask to pattern a layer with varying pitch and at least two critical dimensions and the formation of a transistor sidewall spacer from a mask layer reduces manufacturing costs.

An example of a device, which may take advantage of the reduction of the spacing narrower than the conventional lithography limit in a first region and the formation of a transistor spacer, is an integrated circuit wherein there is a FLASH memory cell in a first region and control devices in a second region. The formation of such a memory cell would be capable of operating at significantly higher speeds than traditional memory cell devices formed by conventional processes. Additionally, the scaling of the memory cells and control cells would allow a higher yield per wafer.

It will further be appreciated that the semiconductor device 10 may alternatively have other shapes than the shapes shown in FIG. 1. Thus, there has been disclosed a method of producing a hard mask that fully satisfies the advantages set forth above. This method permits the reduction in a minimum dimension in a portion of a lithographic image beyond what is possible by improved lithographic resolution brought about by new lithographic tool enhancements. Additionally, the method allows for the formation of core and periphery gates with varying pitch and at least two critical dimensions using two critical masking steps and one non-critical masking step. Further, two etch steps are used to transfer the line and space pattern from the hard mask to the layer. Finally, a transistor spacer is formed from a mask layer used in the formation of the hard mask.

Although particular embodiments of the invention have been described in detail, it is understood that the invention is not limited correspondingly in scope, but includes all changes, modifications and equivalents coming within the spirit and terms of the claims appended hereto.

What is claimed is:

1. A method of forming a layer comprising a line and space pattern over a substrate including a first region and a second region, the method comprising the steps of:

depositing and patterning a first hard mask layer over the layer to form a master line and space pattern therein, wherein a first master line and space pattern in the first hard mask layer includes at least one line and at least one space of a minimum dimension dictated by a resolution limit of lithography;

etching the layer to form the line and space pattern in the second region corresponding to the first master line and space pattern in the first hard mask layer in the second region, wherein a line in the second region includes a first critical dimension (B) achievable at the resolution limit of lithography;

depositing a second hard mask layer over the patterned first hard mask layer, etching the second hard, mask layer to form sidewall spacers on sidewalls of at the least one line in the first hard mask layer in the first region, wherein the minimum dimension of the at least one space in the first hard mask layer in the first region is reduced to a second critical dimension (A) less than achievable at the resolution limit of lithography;

to form sidewall spacers on sidewalls of the at least one line in the second region; and etching the layer to form the line and space pattern in the first region corresponding to the first master line and space pattern in the first hard mask layer in the first region, wherein a space in the first region includes the second critical dimension (A) less than achievable by the resolution limit of lithography.

2. The method according to claim 1, wherein the hard mask layer comprises a material of at least one of silicon oxide, ($Si_xO_y$), silicon-dioxide ($SiO_2$), other oxides; silicon nitride ($Si_xN_y$), silicon rich nitride, oxygen rich nitride, other nitrides; the aforementioned materials implanted with any element; the aforementioned materials in layered or graded composition combinations; the aforementioned materials in porous, amorphous or nanocrystalline form; and mixtures thereof.

3. The method according to claim 1, wherein the layer includes a material of at least one of silicon, germanium, silicon-germanium alloys, silicon-carbon alloys, silicon-germanium alloys containing carbon, and other conductive and semi-conductive materials; the aforementioned materials implanted with any element; the aforementioned materials in layered or graded composition combinations; the aforementioned materials in porous; amorphous, single crystal, polycrystalline, nanocrystalline form; and mixtures thereof.

4. The method according to claim 1, further comprising the steps of:

depositing an anti-reflective coating (ARC) on the first hard mask layer;

patterning the ARC and the first hard mask layer to form a second master-line and space pattern therein, the second master line and space pattern includes lines and spaces including a minimum dimension achievable at the resolution limit of lithography; and depositing the second hard mask layer over the second master line and space pattern.

5. The method according to claim 1, further comprising the steps of:

depositing, patterning and etching a first photosensitive layer to form lines and at least one space therebetween, the lines in the first photosensitive layer include vertical walls and the at least one space therebetween includes the minimum dimension (B) achievable at the resolution limit of lithography; and forming a first hard mask by transferring to the first hard mask layer a first patterned image of the first photosensitive layer by anisotropically etching the first hard mask layer to form therein lines and at least one space, the at least one space in the hard mask layer includes vertical walls and the minimum dimension (B) achievable at the resolution limit of lithography.

6. The method according to claim 5, wherein the first photosensitive layer comprises photoresist.

7. The method according to claim 5, further comprising the steps of:

depositing, patterning and etching a second photosensitive layer over the substrate to form a second patterned image therein, comprising:
masking the first region, and
exposing the second region, and transferring to the layer the line and space pattern of an exposed portion of the first master line and space pattern of the first hard mask layer by anisotropically etching the layer to form at least one line therein in the second region,
wherein the at least one line in the layer in the second region includes substantially vertical walls and the second critical dimension (B).

8. The method according to claim 7, wherein the second photosensitive layer comprises a photoresist.

9. The method according to claim 1, wherein the layer comprises multiple layers.

10. The method according to claim 1, further comprising the steps of:
forming a dielectric layer over the substrate, and
forming the first hard mask layer over the dielectric layer,
wherein the dielectric layer includes:
a charge-trapping dielectric layer in the first region, and
a gate dielectric layer in the second region;
wherein the charge-trapping dielectric layer includes:
a tunneling layer,
a charge-trapping layer and
an insulating layer,
wherein the tunneling layer is disposed over the substrate, the charge-trapping layer is disposed over the tunneling layer and the insulating layer is disposed over the charge-trapping layer.

11. The method according to claim 1, wherein the first region includes a core region and the second region includes a periphery region.

12. The method according to claim 11, wherein the line and space pattern in the layer forms a core gate in the core region and a periphery gate in the periphery region.

13. A method of patterning a layer on a substrate including a first region and a second region, the method comprising the steps of:

providing a substrate including the layer to be patterned interposed between the substrate and a first hard mask layer to be patterned;

coating the first hard mask layer to be patterned with a first photosensitive layer;

patterning and etching the first photosensitive layer to form a first patterned image including lines and at least one space, the lines in the first photosensitive layer and the at least one space include substantially vertical walls and include a minimum dimension (B) achievable at a resolution limit of lithography;

transferring to the first hard mask layer the first patterned image by anisotropically etching the first hard mask layer to form lines and at least one space, the lines and the at least one space in the first hard mask layer include substantially vertical walls and the minimum dimension (B) achievable at the resolution limit of lithography;

coating the first hard mask layer with a second photosensitive layer;

patterning and etching the second photosensitive layer to form a second patterned image including a mask over the first region and exposing the second region;

etching the layer in the second region to form a line and space pattern therein including at least one line in the second region including the critical dimension (B) achievable at the resolution limit of lithography;

depositing a conformal hard mask layer over the hard mask layer, exposed surfaces of the layer and exposed surfaces of the substrate;

forming sidewall spacers on the vertical walls of the lines of the first hard mask in the first region whereby the minimum dimension (B) of the at least one space in the first region is reduced;

forming sidewall spacers on the vertical walls of the at least one line in the second region;

coating the substrate with a third photosensitive layer;

patterning and etching the third photosensitive layer to form a third patterned image,
wherein the first region is exposed and a remaining portion of the third photosensitive layer acts as a mask in the second region;

etching the layer in the first region to form a line and space pattern,
wherein the at least one space in the layer in the first region includes a second critical dimension (A) less than achievable by the resolution limit of lithography.

* * * * *

UNITED STATES PATENT AND TRADEMARK OFFICE
CERTIFICATE OF CORRECTION

PATENT NO. : 6,835,662 B1
DATED : December 28, 2004
INVENTOR(S) : Erhardt et al.

It is certified that error appears in the above-identified patent and that said Letters Patent is hereby corrected as shown below:

Column 1,
Lines 19-20, replace "suicides" with -- silicides --.

Column 15,
Line 50, replace "pattered" with -- patterned --.

Signed and Sealed this

Seventeenth Day of May, 2005

JON W. DUDAS
*Director of the United States Patent and Trademark Office*